United States Patent
Chen

[19]

[11] Patent Number: 6,106,660
[45] Date of Patent: Aug. 22, 2000

[54] ETCHING MACHINE HAVING LOWER ELECTRODE BIAS VOLTAGE SOURCE

[75] Inventor: Wei-Tsung Chen, Hsinchu Hsien, Taiwan

[73] Assignee: United Semiconductor Corp., Hsin-Chu, Taiwan

[21] Appl. No.: 09/062,116

[22] Filed: Apr. 17, 1998

[30] Foreign Application Priority Data

Feb. 20, 1998 [TW] Taiwan .................................. 87102397

[51] Int. Cl.$^7$ ....................................................... H05H 1/00
[52] U.S. Cl. ...................................... 156/345; 315/111.21
[58] Field of Search ....................... 156/345; 204/298.34; 315/111.21; 118/723 E

[56] References Cited

U.S. PATENT DOCUMENTS 5,272,417 12/1993 Ohmi ................................. 156/345 X Primary Examiner—Thi Dang
Attorney, Agent, or Firm—Thomas, Kayden, Horstemeyer & Risley

[57] ABSTRACT

An installation for wafer etching that has an additional bias voltage applied to its lower electrode, comprising a central processing unit, a radio frequency generator, a matching box controller, a radio frequency sensor box, a matching box and an etching machine. The central processing unit is connected to the radio frequency generator and the matching box controller for controlling the generation of radio frequency power and the bias voltage provided by the matching box. The radio frequency sensor box receives the radio frequency power and transfers the radio frequency power to the matching box, while a signal is sent to the matching box controller for controlling the bias voltage supplied to the lower electrode. Consequently, the ions can have more kinetic energy resulting in a greater bombarding effect and the formation of polymer on the wafer is limited. Furthermore, the effect of helium loss can be minimized and down time of the etching machine can be greatly reduced. Hence, product stability can be increased as well.

8 Claims, 3 Drawing Sheets

ETCHING MACHINE HAVING LOWER ELECTRODE BIAS VOLTAGE SOURCE

BACKGROUND OF THE INVENTION

1. Field of Invention

The present invention relates to an etching machine. More particularly, the present invention relates to an etching machine that includes installation for supplying an additional biased voltage to the lower electrode of the machine.

2. Description of Related Art

FIG. 1 is a diagram showing the internal structure of a conventional etching machine. As shown in FIG. 1, the etching machine 2 comprises a process chamber 4, an upper radio frequency (RF) matching element 6, an upper RF matching element driver 8, an RF sensor box 10 and a system controller 12.

The process chamber 4 includes an upper electrode 14 and a lower electrode 16. In general, a wafer 18 is placed on top of the lower electrode 16, and the lower electrode is directly connected to a ground. In operation, voltage supplied to the upper electrode is adjusted so that the combined resistance of the upper and lower electrodes is maintained at around 50 Ω.

The upper RF matching element 6 comprises a matching transformer 20, a manual adjustment knob 21, capacitor units 22 and 23, and variable capacitors 25 and 26. The manual adjustment knob 21 is used for controlling the magnitude of change in the matching transformer 20 whose output is sent to the upper electrode 14. The capacitor units 22 and 23 form capacitor assemblies by connecting with their respective variable capacitors 25 and 26 in parallel.

The upper RF matching element driver 8 comprises two motors 27 and 28, which are connected to the variable capacitors 25 and 26 of the upper RF matching element 6, respectively.

The RF sensor box 10 comprises a coil 30, an RF generator 32 and an RF sensor computer display device 34. The RF sensor computer display device 34 receives voltage signals from the RF generator 32 and current signals from the sensing coil 30, and then displays the data. In addition, the designated frequency produced by the RF generator 32 is around 13.56 MHz and the designated resistance between the upper and lower electrodes is about 50 Ω.

The system controller 12 comprises a computer display device 36, a manual adjustment device 38 and a computer system installation 40. In operation, the etching machine 2 is normally controlled by the system computer. Under exceptional circumstances, the machine can be operated using the manual adjustment device 38.

Theoretically, when the lower electrode 16 is connected to a ground and the resistance of the upper electrode 14 is set by the RF generator 32 to 50 Ω, the system will automatically adjust the resistance in the upper electrode 14 to about 50 Ω. However, in reality, a corresponding bias voltage will be generated in the lower electrode 16 so that the resistance between the upper and lower electrodes will be different from the value of 50 Ω. Consequently, it is very difficult to control etching operation at the peripheral region between the upper and lower electrode.

Therefore, when a wafer is placed on top of the lower electrode 16 and the etching operation begins, polymers can accumulate at the peripheral region of the wafer. This will lead to a high backside helium flow. When helium loss is serious, etching rate can become highly non-uniform. Hence, portions of the wafer surface may be over-etched, leading to low yield and product wastage.

In light of the foregoing, there is a need to improve the design of an etching machine.

SUMMARY OF THE INVENTION

Accordingly, the present invention is to add a bias voltage source supplying a bias voltage to the lower electrode of an etching machine. In this manner, the upper and lower electrodes can match so that a constant resistance of around 50 Ω is maintained, and a greater amount of energy can be transferred to the ions resulting in a higher bombarding effect. Furthermore, the formation of polymer can be limited and the problem due to peripheral helium loss can be resolved, hence resulting in a reduced machine down time and an increase in product stability.

To achieve these and other advantages and in accordance with the purpose of the invention, as embodied and broadly described herein, the invention provides an installation for wafer etching having a bias voltage source applied to its lower electrode. The etching installation comprises an etching machine that has an upper electrode and a lower electrode, where a first voltage is applied to the upper electrode, and a lower electrode bias voltage generator connected to the lower electrode of the machine, where a second voltage is applied to the lower electrode.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DESCRIPTION OF THE PREFERRED EMBODIMENTS

Figure 1:
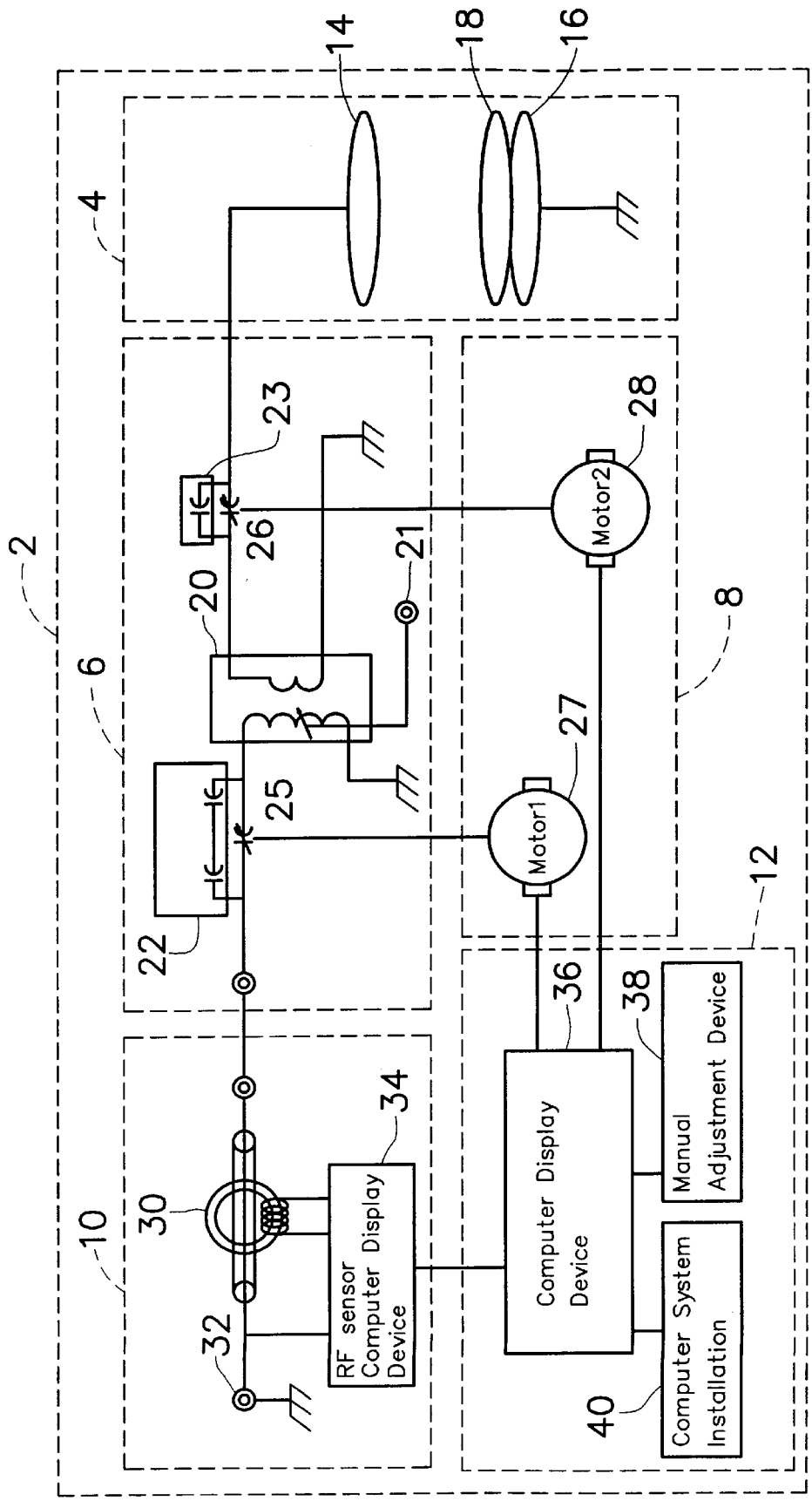
FIG. 1 is a diagram showing the internal structure of a conventional etching machine.

Reference will now be made in detail to the present preferred embodiments of the invention, examples of which are illustrated in the accompanying drawings. Wherever possible, the same reference numbers are used in the drawings and the description to refer to the same or like parts.

Figure 2:
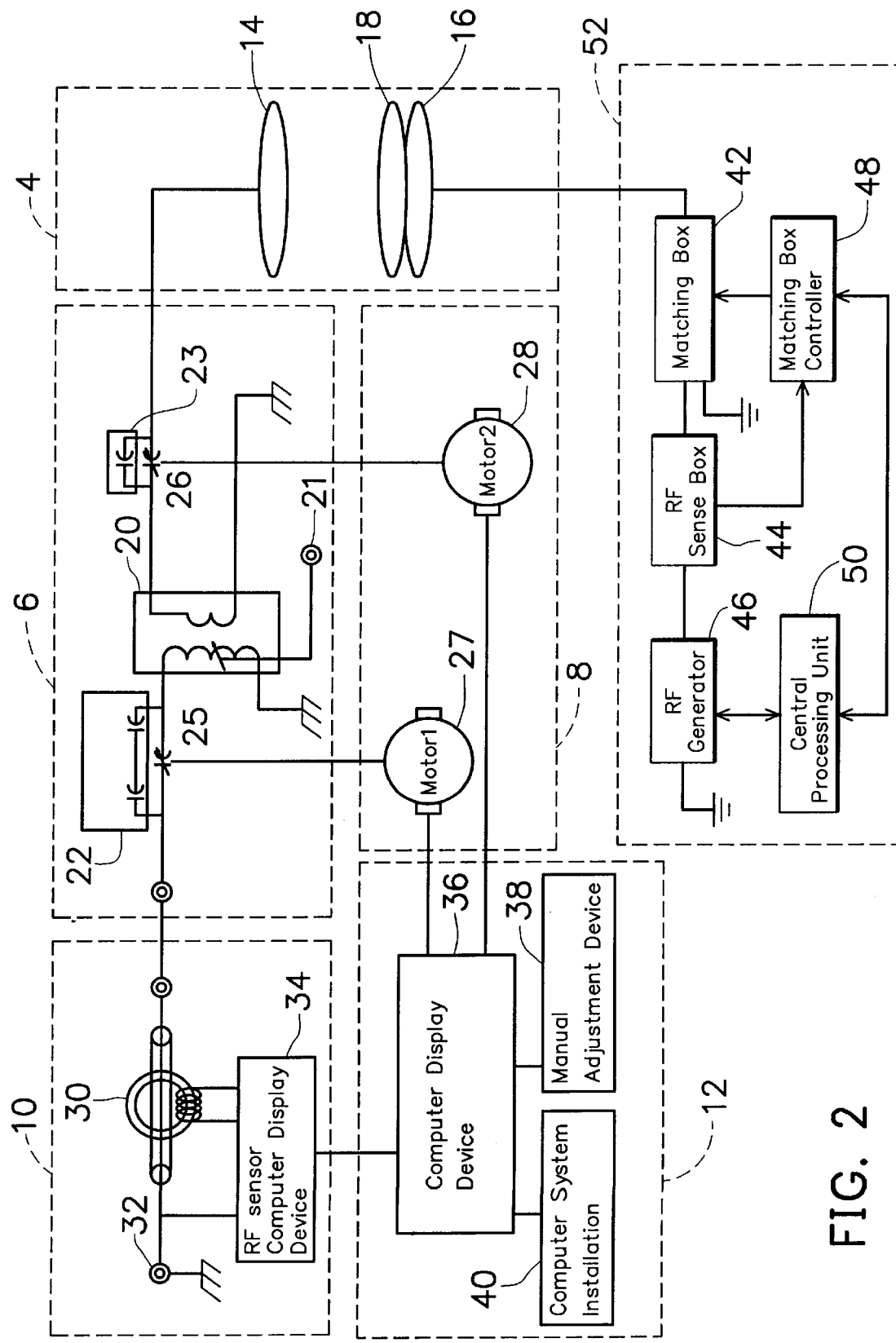
FIG. 2 is a diagram showing the internal structure of an etching machine that has an additional lower electrode bias voltage source according to the preferred embodiment of this invention.

FIG. 2 is a diagram showing the internal structure of an etching machine that has an additional lower electrode bias voltage source according to the preferred embodiment of this invention.

As shown in FIG. 2, the upper portion of the diagram is a duplication of the conventional etching machine. The only difference lies in the lower electrode connection. While a conventional etching machine has its lower electrode directly connected to a ground as shown in FIG. 1, the lower electrode is connected to a lower electrode bias voltage generator 52 instead. Therefore, identical labels are used in subsequent description and details related to the upper part of FIG. 2 are not repeated here.

The additional lower electrode bias voltage generator 52 of this invention comprises a matching box 42, a matching box controller 48, an RF generator 46, an RF sensor box 44 and a central processing unit 50. First, the original ground wire from the lower electrode 16 is now re-routed to the matching box 42 whose bias voltage is variable. The matching box 42 is able to supply a bias voltage source to the lower electrode 16. Consequently, the resistance between the upper electrode 14 and the lower electrode 16 can be maintained at an almost constant value of, for example, 50 Ω.

The matching box controller 48 sends controlling signals to the matching box 42 so that a proper bias voltage can be supplied to the lower electrode 16. Another signal is also sent by the matching box controller 48 to the central processing unit 50. When the RF sensor box 44 receives the RF power generated by the RF generator 46, a signal will be sent to the matching box controller 48. From the central processing unit 50, a controlling signal is sent to the RF generator 46 and the matching box controller 48. The central processing unit 50 also receives feedback signals from the matching box controller 48 so that voltage generated by the RF generator 46 is adjusted through the matching box controller 48.

Consequently, a proper bias voltage is output to the lower electrode from the matching box 42. Therefore, bias voltage at the lower electrode 16 is able to match the upper electrode 14 so that a constant resistance of about 50 Ω can be maintained.

Next, a shown in the upper portion of FIG. 2, a frequency of about 13.56 MHz and a voltage having a resistance z of about 50 Ω is generated by the RF generator 32. The voltage is sent via a coil 30 and the variable transformer 20 to the upper electrode 14. As soon as the resistance between the upper and lower electrode is detected to be deviating from the designated 50 Ω, the computer system will activate motors 27 and 28 to change the setting of the variable capacitors 25 and 26. Hence, output voltage from the variable transformer 20 is changed, narrowing the resistance gap.

Similarly, corresponding voltage-sensing devices and feedback systems for the lower electrode 16 also work in tandem with the upper electrode 14, so that a properly varied bias voltage is supplied to the lower electrode 16. Therefore, as etching is being conducted by the machine, the wafer 18 will be little affected by a helium loss problem, which can lead to an uneven temperature across the wafer. Hence, over-etching of certain portions of the wafer 18 is prevented, and low yield rate and product wastage is reduced to a minimum.

Figure 3:
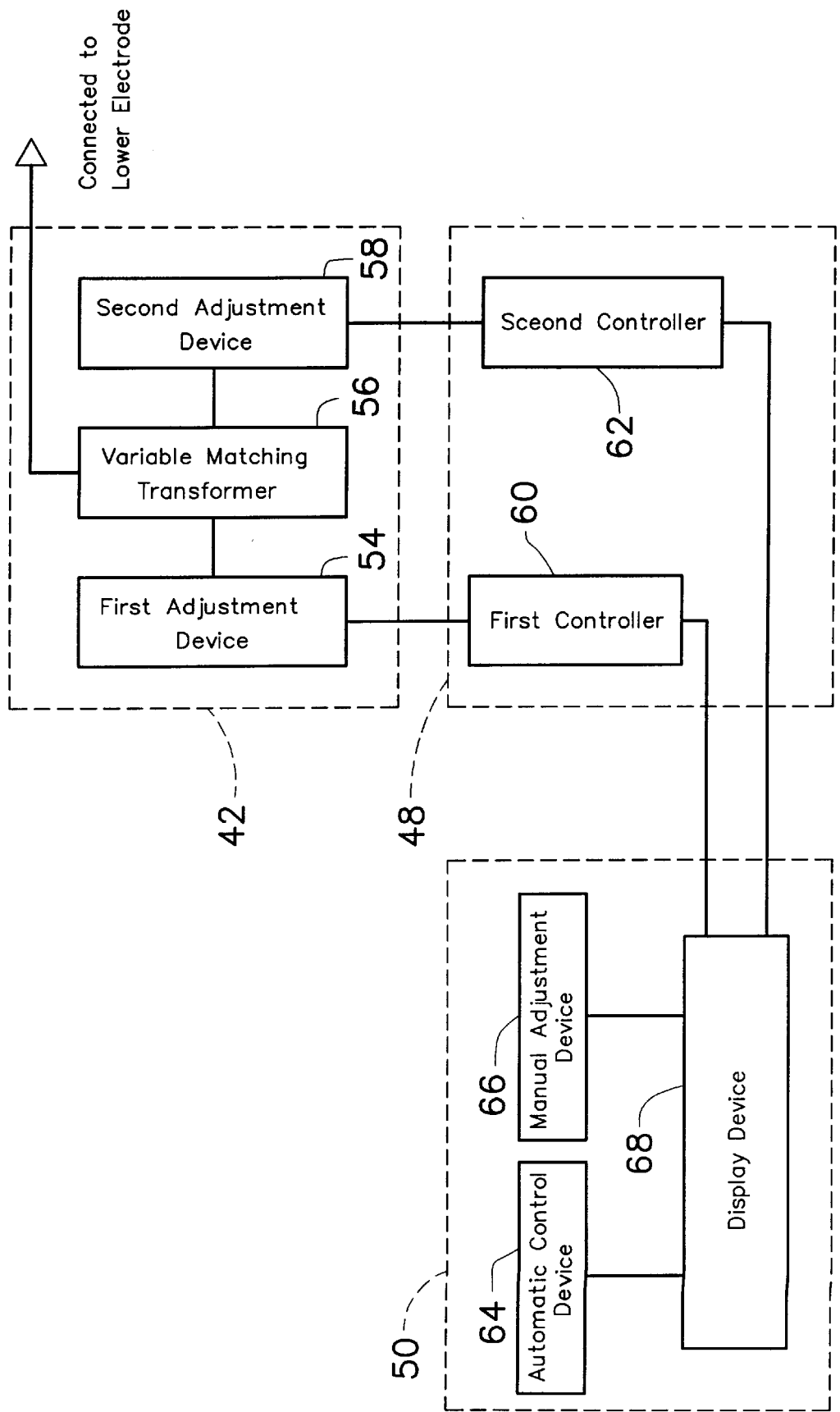
FIG. 3 is a diagram showing the internal components and their connectivity between external devices for the matching box, the matching box controller and the central processing unit of FIG. 2.

FIG. 3 is a diagram showing the internal components and their connectivity between external devices for the matching box, the matching box controller and the central processing unit of FIG. 2. In FIG. 3, the matching box 42 includes a variable matching transformer 56, a first adjustment device 54 and a second adjustment device 58. The first adjustment device 54 and the second adjustment device 58 are installed respectively on each side of the variable matching transformer 56, while the variable matching transformer 56 is connected to the lower electrode 16.

The matching box controller 48 includes a first controller 60 and a second controller 62. The first controller 60 and the second controller 62 are connected to the first adjustment device 54 and the second adjustment device 58, respectively.

The central processing unit 50 includes an automatic control device 64, a manual adjustment device 66 and a display device 68. Both the automatic control device 64 and the manual adjustment device 66 are connected to the display device 68, which in turn is connected to the first controller 60 and second controller 62.

In operation, adjusting signals from the automatic control device 64 or the manual adjustment device 66 is first transmitted to the display device 68 whose data is displayed on the display device 68. Afterwards, signals from the automatic control device 64 and the manual adjustment device 55 are passed to the first controller 60 and the second controller 62. The first controller 60 and the second controller 62 then control the respective first adjustment device 54 and the second adjustment device 58 so that the output bias voltage from the variable matching transformer 56 is varied accordingly.

As a summary, this invention provides an additional bias voltage source to the lower electrode of the etching machine. With this additional bias voltage supply, resistance formed by the upper and lower electrode pair can be maintained at a set constant value. Unlike a conventional arrangement where the lower electrode is connected to earth, this invention will not be affected by bias voltage.

Furthermore, the application of a bias voltage to the lower electrode is able to increase the kinetic energy of ions, which allows the ions to have a greater bombarding effect during etching. Consequently, the formation of polymer on the wafer is limited and the effect of helium loss can be minimized. As portions of the wafer will not be over-etched, a smoother wafer etch is obtained. In addition, down time of the etching machine can be greatly reduced and product stability can be increased as well.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. An installation for wafer etching, comprising:

an etching machine that has an upper electrode and a lower electrode, wherein a first voltage is applied to the upper electrode; and a lower electrode bias voltage generator connected to the lower electrode of the etching machine to dynamically apply a varying bias voltage to the lower electrode, wherein the lower electrode bias voltage generator further includes:

a matching box connected to the lower electrode for supplying the bias voltage;

a matching box controller connected to the matching box for transmitting a first signal and a second signal, wherein the first signal is sent to the matching box for adjusting the bias voltage provided by the matching box;

a radio frequency generator for generating a radio frequency voltage and transmitting a third signal;

a radio frequency sensor box for receiving the radio frequency voltage from the radio frequency generator and then transferring the radio frequency voltage to the matching box, and transmitting a fourth signal to the matching box controller for controlling the matching box controller; and a central processing unit for receiving the third signal from the radio frequency generator and the second signal from the matching box controller, and then transmitting a first control signal to the radio frequency generator and a second control signal to the matching box controller, wherein the first control signal is used for controlling the radio frequency voltage of the radio frequency generator and the second control signal is used for controlling the adjustment of the matching box controller.

2. The installation of claim 1, wherein the matching box further includes:

a variable matching transformer for providing the bias voltage to the lower electrode;

a first adjustment device connected to the variable matching transformer for adjusting a setting of the variable matching transformer; and a second adjustment device connected to the variable matching transformer for adjusting a setting of the variable matching transformer.

3. The installation of claim 1, wherein the matching box controller further includes:

a first controller connected to the first adjustment device for controlling the first adjustment device; and a second controller connected to the second adjustment device for controlling the second adjustment device.

4. The installation of claim 1, wherein the central processing unit further includes:

a manual adjustment device for controlling a setting of the bias voltage, manually;

an automatic control device for controlling a setting of the bias voltage, automatically; and a display device connected to the manual adjustment device and the automatic control device for displaying adjustment data.

5. An installation for wafer etching, comprising:

an etching machine that has an upper electrode and a lower electrode, wherein an upper-electrode voltage is applied to the upper electrode; and a lower-electrode-bias voltage generator connected to the lower electrode of the etching machine to dynamically apply a varying bias voltage to the lower electrode so that a resistance between the upper electrode and the lower electrode remains substantially constant while the etching machine is in operation, wherein the lower-electrode-bias voltage generator further includes;

a matching box connected to the lower electrode for supplying the bias voltage;

a matching-box controller connected to the matching box for transmitting a first signal and a second signal, wherein the first signal is sent to the matching box for adjusting the bias voltage provided by the matching box;

a radio frequency (RF) generator for generating a RF voltage and transmitting a third signal;

a RF sensor box for receiving the RF voltage from the RF generator and then transferring the RF voltage to the matching box, and transmitting a fourth signal to the matching-box controller for controlling the matching-box controller; and a central processing unit for receiving the third signal from the RF generator and the second signal from the matching-box controller, and then transmitting a first control signal to the RF generator and a second control signal to the matching-box controller, wherein the first control signal is used for controlling the RF voltage of the RF generator and the second control signal is used for controlling the adjustment of the matching-box controller.

6. The installation of claim 5, wherein the matching box further includes:

a variable matching transformer for providing the bias voltage to the lower electrode;

a first adjustment device connected to the variable matching transformer for adjusting a setting of the variable matching transformer; and a second adjustment device connected to the variable matching transformer for adjusting a setting of the variable matching transformer.

7. The installation of claim 5, wherein the matching-box controller further includes:

a first controller connected to the first adjustment device for controlling the first adjustment device; and a second controller connected to the second adjustment device for controlling the second adjustment device.

8. The installation of claim 5, wherein the central processing unit further includes:

a manual adjustment device for controlling a setting of the bias voltage, manually;

an automatic control device for controlling a setting of the bias voltage, automatically; and a display device connected to the manual adjustment device and the automatic control device for displaying adjustment data.

* * * * *